(12) United States Patent
Meotto et al.

(10) Patent No.: US 12,207,473 B2
(45) Date of Patent: Jan. 21, 2025

(54) MEMORY DEVICES

(71) Applicant: Lodestar Licensing Group LLC, Evanston, IL (US)

(72) Inventors: Umberto Maria Meotto, Dietlikon (CH); Emilio Camerlenghi, Bergamo (IT); Paolo Tessariol, Arcore (IT); Luca Laurin, Lissone (IT)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

(21) Appl. No.: 18/499,703

(22) Filed: Nov. 1, 2023

(65) Prior Publication Data

US 2024/0064990 A1 Feb. 22, 2024

Related U.S. Application Data

(63) Continuation of application No. 17/819,009, filed on Aug. 11, 2022, now Pat. No. 11,818,893, which is a
(Continued)

(51) Int. Cl.
*H10B 43/40* (2023.01)
*H01L 23/522* (2006.01)
(Continued)

(52) U.S. Cl.
CPC ......... *H10B 43/40* (2023.02); *H01L 23/5226* (2013.01); *H01L 23/5283* (2013.01);
(Continued)

(58) Field of Classification Search
None
See application file for complete search history.

(56) References Cited

U.S. PATENT DOCUMENTS 4,925,809 A 5/1990 Yoshiharu et al.
6,165,247 A 12/2000 Kodas et al.
(Continued)

FOREIGN PATENT DOCUMENTS

CN 107768376 A 3/2018
CN 107887395 A 4/2018
(Continued)

OTHER PUBLICATIONS

Chinese First Office Action for Chinese Application No. 202110966680.2, dated Nov. 4, 2022, 13 pages with translation.
(Continued)

*Primary Examiner* — Hsien Ming Lee
(74) *Attorney, Agent, or Firm* — TraskBritt

(57) ABSTRACT

A method of forming a microelectronic device comprises forming a memory array region comprising memory cells vertically over a base structure comprising a semiconductive material and alignment mark structures vertically extending into the semiconductive material. First contact structures are formed to extend through the memory array region and into the alignment mark structures. A support structure is formed over the memory array region. A portion of the base structure is removed to expose the alignment mark structures. A control logic region is formed vertically adjacent a remaining portion of the base structure. The control logic region comprises control logic devices in electrical communication with the first contact structures by way of second contact structures extending partially through the alignment mark structures and contacting the first contact structures. Microelectronic devices, memory devices, electronic systems, and additional methods are also described.

18 Claims, 8 Drawing Sheets

Related U.S. Application Data continuation of application No. 17/000,754, filed on Aug. 24, 2020, now Pat. No. 11,417,676.

(51) Int. Cl.
*H01L 23/528* (2006.01)
*H01L 23/544* (2006.01)
*H10B 41/27* (2023.01)
*H10B 41/35* (2023.01)
*H10B 41/41* (2023.01)
*H10B 43/27* (2023.01)
*H10B 43/35* (2023.01)

(52) U.S. Cl.
CPC ........... *H01L 23/544* (2013.01); *H10B 41/27* (2023.02); *H10B 41/35* (2023.02); *H10B 41/41* (2023.02); *H10B 43/27* (2023.02); *H10B 43/35* (2023.02); *H01L 2223/54426* (2013.01)

(56) References Cited

U.S. PATENT DOCUMENTS

| | | |
|---|---|---|
| 7,087,452 B2 | 8/2006 | Joshi et al. |
| 7,372,091 B2 | 5/2008 | Leslie |
| 7,897,485 B2 | 3/2011 | Parekh |
| 8,042,082 B2 | 10/2011 | Solomon |
| 8,958,228 B2 | 2/2015 | Samachisa et al. |
| 9,196,753 B2 | 11/2015 | Ramaswamy et al. |
| 9,397,145 B1 | 7/2016 | Sills et al. |
| 9,449,652 B2 | 9/2016 | Juengling |
| 9,515,083 B2 | 12/2016 | Lee et al. |
| 9,530,790 B1 | 12/2016 | Lu et al. |
| 9,553,263 B1 | 1/2017 | Petz et al. |
| 9,590,012 B2 | 3/2017 | Lee et al. |
| 9,653,617 B2 | 5/2017 | Zhou et al. |
| 9,893,207 B1 | 2/2018 | Balakrishnan et al. |
| 9,922,716 B2 | 3/2018 | Hsiung et al. |
| 10,141,330 B1 | 11/2018 | Lindsay et al. |
| 10,283,703 B2 | 5/2019 | Pellizzer et al. |
| 10,381,362 B1 | 8/2019 | Cui et al. |
| 10,622,369 B2 | 4/2020 | Zhou et al. |
| 10,665,580 B1 | 5/2020 | Hosoda et al. |
| 10,847,220 B2 | 11/2020 | Castro |
| 11,282,815 B2 | 3/2022 | Parekh et al. |
| 11,335,602 B2 | 5/2022 | Parekh |
| 11,380,669 B2 | 7/2022 | Parekh |
| 11,545,456 B2 | 1/2023 | Goda et al. |
| 11,557,569 B2 | 1/2023 | Parekh |
| 11,563,018 B2 | 1/2023 | Parekh |
| 11,818,893 B2 * | 11/2023 | Meotto ................. H10B 41/41 |
| 2003/0113669 A1 | 6/2003 | Cheng et al. |
| 2003/0151083 A1 | 8/2003 | Matsui et al. |
| 2005/0265076 A1 | 12/2005 | Forbes |
| 2006/0076690 A1 | 4/2006 | Khandros et al. |
| 2007/0240900 A1 | 10/2007 | Yokomaku |
| 2007/0288702 A1 | 12/2007 | Roohparvar |
| 2008/0019165 A1 | 1/2008 | Lin et al. |
| 2009/0168482 A1 | 7/2009 | Park et al. |
| 2011/0159645 A1 | 6/2011 | Pekny |
| 2011/0309431 A1 | 12/2011 | Kidoh et al. |
| 2012/0047321 A1 | 2/2012 | Yoon et al. |
| 2012/0161094 A1 | 6/2012 | Huo et al. |
| 2012/0181602 A1 | 7/2012 | Fukuzumi et al. |
| 2012/0224426 A1 | 9/2012 | Nam et al. |
| 2013/0126622 A1 | 5/2013 | Finn |
| 2013/0130468 A1 | 5/2013 | Higashitani et al. |
| 2014/0001583 A1 | 1/2014 | Teh et al. |
| 2014/0061750 A1 | 3/2014 | Kwon et al. |
| 2014/0063938 A1 | 3/2014 | Oh et al. |
| 2014/0124726 A1 | 5/2014 | Oh |
| 2014/0175637 A1 | 6/2014 | Stuber et al. |
| 2014/0204675 A1 | 7/2014 | Cho et al. |
| 2015/0091180 A1 | 4/2015 | Ong et al. |
| 2015/0243708 A1 | 8/2015 | Ravasio et al. |
| 2015/0278675 A1 | 10/2015 | Finn et al. |
| 2015/0348987 A1 | 12/2015 | Lee et al. |
| 2016/0049201 A1 | 2/2016 | Lue et al. |
| 2016/0079164 A1 | 3/2016 | Fukuzumi et al. |
| 2016/0104715 A1 | 4/2016 | Pachamuthu et al. |
| 2016/0163386 A1 | 6/2016 | Hwang et al. |
| 2016/0268304 A1 | 9/2016 | Ikeda et al. |
| 2016/0343727 A1 | 11/2016 | Kim et al. |
| 2017/0025421 A1 | 1/2017 | Sakakibara et al. |
| 2017/0054036 A1 | 2/2017 | Dorhout et al. |
| 2017/0092649 A1 | 3/2017 | Takaoka |
| 2017/0148802 A1 | 5/2017 | Dorhout et al. |
| 2018/0053768 A1 | 2/2018 | Kim et al. |
| 2018/0108741 A1 | 4/2018 | Li et al. |
| 2018/0158689 A1 | 6/2018 | Mumford |
| 2018/0269329 A1 | 9/2018 | Balakrishnan et al. |
| 2018/0358476 A1 | 12/2018 | Balakrishnan et al. |
| 2019/0043836 A1 | 2/2019 | Fastow et al. |
| 2019/0081069 A1 | 3/2019 | Lu et al. |
| 2019/0088493 A1 | 3/2019 | Watanabe et al. |
| 2019/0096906 A1 | 3/2019 | Lindsay et al. |
| 2019/0206861 A1 | 7/2019 | Beigel et al. |
| 2019/0221557 A1 | 7/2019 | Kim et al. |
| 2019/0229089 A1 | 7/2019 | Zhou et al. |
| 2019/0279952 A1 | 9/2019 | Tagami |
| 2019/0355786 A1 | 11/2019 | Iguchi |
| 2019/0393238 A1 | 12/2019 | Lim et al. |
| 2020/0006380 A1 | 1/2020 | Van et al. |
| 2020/0013792 A1 | 1/2020 | Parekh et al. |
| 2020/0013798 A1 | 1/2020 | Parekh |
| 2020/0027892 A1 | 1/2020 | Zhu et al. |
| 2020/0066745 A1 | 2/2020 | Yu et al. |
| 2020/0083245 A1 | 3/2020 | Fayrushin et al. |
| 2020/0098776 A1 * | 3/2020 | Sugisaki ................ H10B 43/40 |
| 2020/0135541 A1 | 4/2020 | Wu et al. |
| 2020/0159133 A1 | 5/2020 | Yan et al. |
| 2020/0161295 A1 | 5/2020 | Sills et al. |
| 2020/0185406 A1 | 6/2020 | Li et al. |
| 2020/0219815 A1 | 7/2020 | Elsherbini et al. |
| 2020/0227397 A1 | 7/2020 | Yada et al. |
| 2020/0227429 A1 | 7/2020 | Ji et al. |
| 2020/0243473 A1 | 7/2020 | Wang et al. |
| 2020/0258816 A1 | 8/2020 | Okina et al. |
| 2020/0258876 A1 | 8/2020 | Hosoda et al. |
| 2020/0258904 A1 | 8/2020 | Kai et al. |
| 2020/0273840 A1 | 8/2020 | Elsherbini et al. |
| 2020/0350321 A1 | 11/2020 | Cheng et al. |
| 2021/0074711 A1 | 3/2021 | Suzuki et al. |
| 2021/0082939 A1 | 3/2021 | Matsuda |
| 2021/0134778 A1 | 5/2021 | Huang et al. |
| 2021/0296316 A1 | 9/2021 | Zhu |
| 2021/0343690 A1 | 11/2021 | Salmon |
| 2021/0398847 A1 | 12/2021 | Parekh |
| 2021/0398897 A1 | 12/2021 | Parekh |
| 2022/0020736 A1 | 1/2022 | Yip et al. |
| 2022/0028830 A1 | 1/2022 | Kirby |
| 2022/0059560 A1 | 2/2022 | Parekh |
| 2022/0238631 A1 | 7/2022 | Zierak et al. |
| 2022/0336646 A1 | 10/2022 | Ontalus et al. |
| 2022/0416029 A1 | 12/2022 | Ontalus |
| 2023/0301191 A1 | 9/2023 | Ferrari et al. |

FOREIGN PATENT DOCUMENTS

| | | |
|---|---|---|
| CN | 108447865 A | 8/2018 |
| CN | 110140213 A | 8/2019 |
| CN | 111247636 A | 6/2020 |
| JP | 2002-103299 A | 4/2002 |
| JP | 2010-153799 A | 7/2010 |
| JP | 2016-062901 A | 4/2016 |
| JP | 2019-024087 A | 2/2019 |
| JP | 2019-220244 A | 12/2019 |
| KR | 10-2009-0034570 A | 4/2009 |
| KR | 10-2014-0117062 A | 10/2014 |
| KR | 10-2015-0085155 A | 7/2015 |
| KR | 10-2020-0008606 A | 1/2020 |
| KR | 10-2020-0037444 A | 4/2020 |
| TW | 201511319 A | 3/2015 |

(56) References Cited

FOREIGN PATENT DOCUMENTS

| TW | 201826556 A | 7/2018 |
|---|---|---|
| TW | 201838153 A | 10/2018 |
| TW | 201941407 B | 10/2019 |
| TW | 201946057 A | 12/2019 |
| TW | 202008568 B | 2/2020 |
| WO | 2008/063251 A2 | 5/2008 |
| WO | 2019/052127 A1 | 3/2019 |

OTHER PUBLICATIONS

Choe, Jeongdong, YMTC is China's First Mass Producer of 3D NANO Flash Memory Chips, https://www.techinsights.com/blog/ymtc-chinas-first-mass-producer-3d-nand-flash-memory-chips, Mar. 12, 2020.

Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.

Micron, Introducing 2nd Generation Micron Mobile TLC 3D NAND, Industry-Leading Storage Solutions for Flagship Smartphones, (2018), 9 pages.

YMTC, About Xtacking, http://www.ymtc.com, visited Apr. 20, 2020.

\* cited by examiner

MEMORY DEVICES

CROSS-REFERENCE TO RELATED APPLICATION

This application is a continuation of U.S. patent application Ser. No. 17/819,009, filed Aug. 11, 2022, now U.S. Pat. No. 11,818,893, issued Nov. 14, 2023, which is a continuation of U.S. patent application Ser. No. 17/000,754, filed Aug. 24, 2020, now U.S. Pat. No. 11,417,676, issued Aug. 16, 2022, the disclosure of each of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices and memory devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the memory device.

DETAILED DESCRIPTION

Figure 1A:
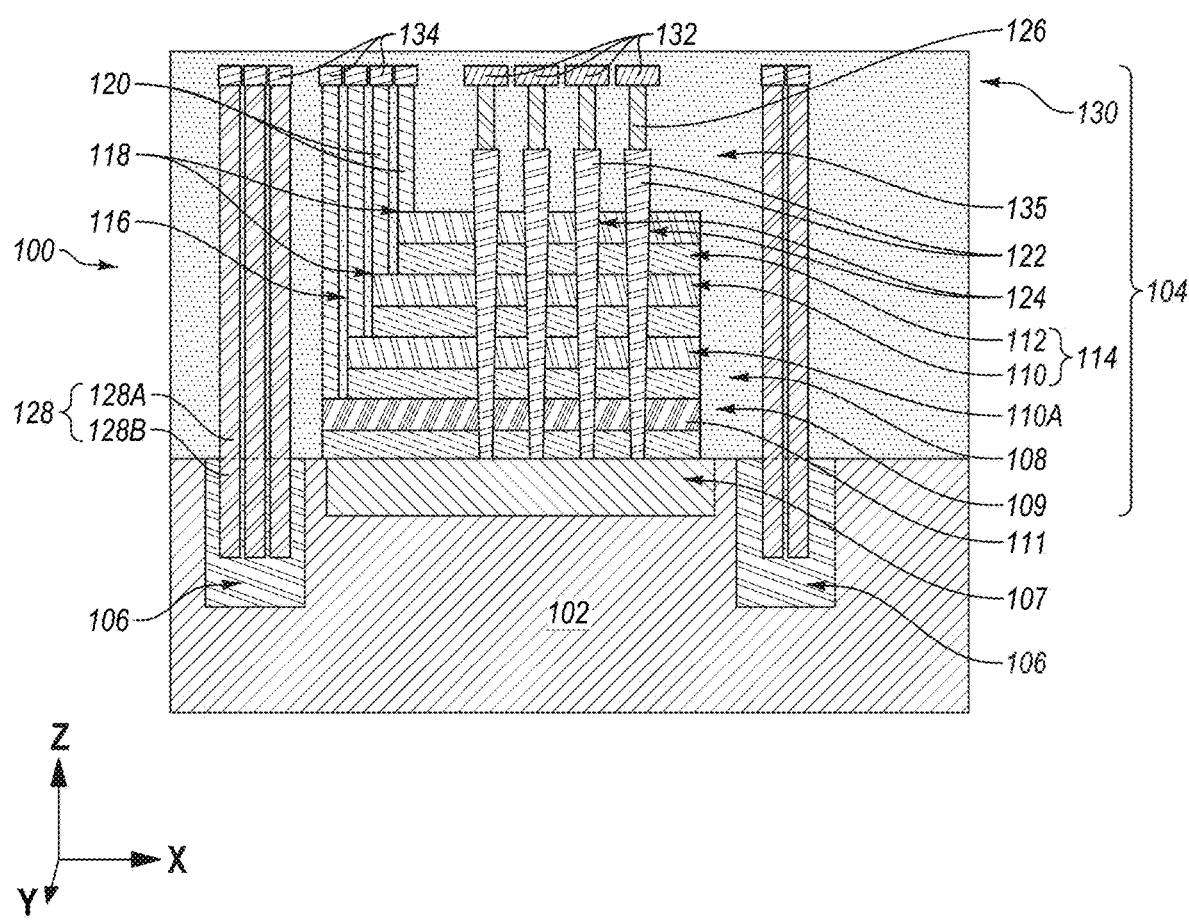
FIGS. 1A through 1E are simplified, partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (H), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe— and Ni-based alloy, a Co— and Ni-based alloy, an Fe— and Co-based alloy, a Co— and Ni— and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization, or other known methods.

FIGS. 1A through 1E are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein may be used to form various devices and electronic systems.

Referring to FIG. 1A, a microelectronic device structure 100 may be formed to include a semiconductive base structure 102, and a memory array region 104 over the semiconductive base structure 102. The semiconductive base structure 102 includes alignment mark structures 106 formed in a semiconductive material thereof. The memory array region 104 includes a stack structure 108 including conductive structures 110 and insulative structures 112; cell pillar structures 122 and deep contact structures 128 vertically extending (e.g., in the Z-direction) through the stack structure 108; at least one conductive routing tier 130 overlying the stack structure 108, and including digit line structures 132 and conductive routing structures 134; at least one source tier 109 vertically underlying the stack structure 108 and including one or more additional conductive structures 111 (e.g., lateral contact structures, source structures) coupled to the cell pillar structures 122; digit line contact structures 126 vertically extending between and coupling the cell pillar structures 122 and the digit line structures 132; and conductive contact structures 120 vertically extending between and coupling some of the conductive routing structures 134 of the conductive muting tier 130 and the conductive structures 110 of the stack structure 108. The microelectronic device structure 100 (including the semiconductive base structure 102 and the memory array region 104 thereof) also includes additional features (e.g., structures, materials, devices), as described in further detail below.

The semiconductive base structure 102 comprises a base material or construction upon which additional features (e.g., materials, structures, devices) of the microelectronic device structure 100 are formed. The semiconductive base structure 102 may comprise a semiconductive structure (e.g., a semiconductive wafer), or a base semiconductive material on a supporting structure. In some embodiments, the semiconductive base structure 102 comprises a semiconductive wafer. For example, the semiconductive base structure 102 may be formed of and include one or more of a silicon material, such monocrystalline silicon and/or polycrystalline silicon (also referred to herein as "polysilicon"); silicon-germanium; germanium; gallium arsenide; a gallium nitride; gallium phosphide; indium phosphide; indium gallium nitride; and aluminum gallium nitride. In some embodiments, the semiconductive base structure 102 is formed of and includes monocrystalline silicon. The semiconductive base structure may, for example, comprise a monocrystalline silicon wafer. As described in further detail below, the semiconductive base structure 102 may include one or more layers, structures, and/or regions formed therein and/or thereon.

The alignment mark structures 106 in the semiconductive base structure 102 may be employed to assist with the alignment and coupling of the deep contact structures 128 with further contact structures to be formed through subsequent processing acts, as described in further detail below. As shown in FIG. 1A, the alignment mark structures 106 may vertically extend (e.g., in the Z-direction) partially (e.g., less than completely) through the semiconductive base structure 102. The alignment mark structures 106 of the semiconductive base structure 102 may detectable (e.g., optically detectable) relative to other features of the semiconductive base structure 102. For example, the alignment mark structures 106 may be formed to have a different material composition and/or a different shape (e.g., a different horizontal cross-sectional shape) than other features of the semiconductive base structure 102. In some embodiments, the alignment mark structures 106 of the semiconductive base structure 102 comprise filled trenches within semiconductive material (e.g., monocrystalline silicon) of the semiconductive base structure 102. The filled trenches may each individually have a desired geometric configuration, and may each individually be filled with at least one desirable material. The geometric configuration and/or the material composition of the filled trenches may facilitate the detection of the filled trenches relative to other features of the semiconductive base structure 102. By way of non-limiting example, the filled trenches may individually comprise at least one material (e.g., at least one other semiconductive material, at least one insulative material, at least one conductive material) having a different material composition than material(s) (e.g., monocrystalline silicon) of other regions of the semiconductive base structure 102. In some embodiments, the filled trenches individually comprise polycrystalline silicon. In additional embodiment, the alignment mark structures 106 comprise regions of the semiconductive base structure 102 doped with one or more materials detectable relative to other material(s) (e.g., undoped semiconductive material, such as undoped monocrystalline silicon) of other regions of the semiconductive base structure 102.

With continued reference to FIG. 1A, at least one isolation structure 107 (e.g., at least one shallow trench isolation (STI) structure) may also be formed within the semiconductive base structure 102. The isolation structure(s) 107 may be formed of and include at least one insulative material. The isolation structure(s) 107 may be employed to electrically isolate one or more features (e.g., the cell pillar structures 122) from portions of the semiconductive base structure 102 thereunder. As shown in FIG. 1A, the isolation structure(s) 107 may horizontally neighbor the alignment mark structures 106 in the semiconductive base structure 102. A vertical depth (e.g., in the Z-direction) of the isolation structure(s) 107 within the semiconductive base structure 102 may be less than a vertical depth of the alignment mark structures 106 within the semiconductive base structure 102. Upper vertical boundaries (e.g., upper surfaces) of the isolation structure(s) 107 may be formed to be substantially coplanar with upper vertical boundaries (e.g., upper surfaces) of the alignment mark structures 106.

Still referring to FIG. 1A, the source tier 109 of the memory array region 104 may be formed vertically between the semiconductive base structure 102 and the stack structure 108. As shown in FIG. 1A, the source tier 109 may be vertically interposed between the isolation structure 107 within the semiconductive base structure 102 and the stack structure 108. At least some of the additional conductive structures 111 of the source tier 109 may be coupled to the cell pillar structures 122. By way of non-limiting example, some of the additional conductive structures 111 may comprise lateral contact structures couple to channel material of the cell pillar structures 122, and at least one other of the additional conductive structures 111 may comprise a source structure couple to the lateral contact structures. The lateral contact structures may, for example, be coupled to the source structure by way of one or more additional contact structures (e.g., vertical contact structure) extending (e.g., vertically extending) from and between the source structure and the lateral contact structures. The additional contact structure(s) may extend (e.g., vertically extend) through at least one insulative material interposed between (e.g., vertically interposed between) the lateral contact structures and the source structure(s).

The additional conductive structures 111 of the source tier 109 may each individually be formed of and include conductive material. As a non-limiting example, the additional conductive structures 111 may be formed of and include at least one semiconductive material (e.g., one or more of a silicon material, such as monocrystalline silicon or polycrystalline silicon; a silicon-germanium material; a germanium material; a gallium arsenide material; a gallium nitride material; and an indium phosphide material) doped with one or more desired conductivity-enhancing dopant(s) (e.g., N-type dopant(s), P-type dopant(s)). In some embodiments, the additional conductive structures 111 of the source tier 109 comprise silicon (e.g., monocrystalline silicon, polycrystalline silicon) doped with at least one N-type dopant (e.g., one or more of phosphorus, arsenic, antimony, and bismuth). In additional embodiments, the additional conductive structures 111 of the source tier 109 comprise silicon (e.g., monocrystalline silicon, polycrystalline silicon) doped with at least one P-type dopant (e.g., one or more of boron, aluminum, and gallium). As another non-limiting example, the additional conductive structures 111 of the source tier 109 may be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the additional conductive structures 111 of the source tier 109 are formed of and include W. The additional conductive structures 111 may individually be substantially homogeneous, or the additional conductive structures 111 may individually be heterogeneous. As used herein, the term "homogeneous" means amounts of a material do not vary throughout different portions (e.g., different horizontal portions, different vertical portions) of a structure. Conversely, as used herein, the term "heterogeneous" means amounts of a material vary throughout different portions of a structure. In some embodiments, the additional conductive structures 111 of the source tier 109 are formed to be substantially homogeneous. In additional embodiments, the additional conductive structures 111 of the source tier 109 formed to be heterogeneous. The additional conductive structures 111 may, for example, individually be formed of and include a stack of at least two different conductive materials.

Still referring to FIG. 1A, the stack structure 108 may be formed to vertically overlie the source tier 109 (including the additional conductive structures 111 thereof), and may include a vertically alternating (e.g., in the Z-direction) sequence of conductive structures 110 and insulative structures 112 arranged in tiers 114. Each of the tiers 114 of the stack structure 108 may include at least one of the conductive structures 110 vertically neighboring at least one of the insulative structures 112. The stack structure 108 may be formed to include any desired number of the tiers 114, such as greater than or equal to sixteen (16) of the tiers 114, greater than or equal to thirty-two (32) of the tiers 114, greater than or equal to sixty-four (64) of the tiers 114, greater than or equal to one hundred and twenty-eight (128) of the tiers 114, or greater than or equal to two hundred and fifty-six (256) of the tiers 114.

The conductive structures 110 of the tiers 114 of the stack structure 108 may be formed of and include conductive material. By way of non-limiting example, the conductive structures 110 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). The conductive structures 110 may be employed as access line structures (e.g., local access line structures, local word line structures) for the memory array region 104. In some embodiments, the conductive structures 110 are formed of and include W. Each of the conductive structures 110 may be substantially homogeneous, or one or more of the conductive structures 110 may individually be substantially heterogeneous. In some embodiments, each of the conductive structures 110 is formed to be substantially homogeneous. In additional embodiments, each of the conductive structures 110 is formed to be heterogeneous. Each of the conductive structures 110 may, for example, be formed of and include a stack of at least two different conductive materials.

Optionally, one or more liner materials (e.g., insulative liner material(s), conductive liner material(s)) may also be formed around the conductive structures 110. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 110. In some embodiments, the liner material(s) comprise titanium nitride. In further embodiments, the liner material(s) further include aluminum oxide. As a non-limiting example, aluminum oxide may be formed directly adjacent the insulative structures 112, titanium nitride may be formed directly adjacent the aluminum oxide, and tungsten may be formed directly adjacent the titanium nitride. For clarity and ease of understanding the description, the liner material(s) are not illustrated in FIG. 1A, but it will be understood that the liner material(s) may be disposed around the conductive structures 110.

At least one lower conductive structure 110 of the stack structure 108 may be employed as at least one lower select gate (e.g., at least one source side select gate (SGS)) of the memory array region 104. In some embodiments, a first conductive structure 110A of a vertically lowermost tier 114 of the stack structure 108 is employed as a lower select gate (e.g., an SGS) of the memory array region 104. In addition, upper conductive structure(s) 110 of the stack structure 108 may be employed as upper select gate(s) (e.g., drain side select gate(s) (SGDs)) of the memory array region 104. In some embodiments, horizontally neighboring (e.g., in the Y-direction) conductive structures 110 of a vertically uppermost tier 114 of the stack structure 108 are employed as upper select gates (e.g., SGDs) of the memory array region 104.

The insulative structures 112 of the tiers 114 of the stack structure 108 may be formed of and include at least one insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 112 is formed of and includes a dielectric oxide material, such as $SiO_x$, (e.g., $SiO_2$). Each of the insulative structures 112 may be substantially homogeneous, may be or a substantially heterogeneous. In some embodiments, each of the insulative structures 112 is substantially homogeneous. In further embodiments, at least one of the insulative structures 112 is substantially heterogeneous. One or more of the insulative structures 112 may, for example, be formed of and include a stack (e.g., laminate) of at least two different insulative materials.

With continued reference to FIG. 1A, the stack structure 108 may further include at least one staircase structure 116 positioned at one or more horizontal end(s) (e.g., in the X-direction) thereof. The staircase structure 116 includes steps 118 at least partially defined by horizontal ends (e.g., in the X-direction) of the tiers 114 of the stack structure 108. The steps 118 of the staircase structure 116 may be employed as contact regions to electrically connect the conductive structures 110 of the tiers 114 of the stack structure 108 to other features (e.g., structures, materials, devices) of the microelectronic device structure 100, as described in further detail below. A quantity of steps 118 included in the staircase structure 116 may be substantially the same as (e.g., equal to) or may be different than (e.g., less than, greater than) the quantity of tiers 114 in the stack structure 108. As shown in FIG. 1A, in some embodiments, the steps 118 of the staircase structure 116 are arranged in order, such that steps 118 directly horizontally adjacent one another in the X-direction correspond to tiers 114 of the stack structure 108 directly vertically adjacent (e.g., in the Z-direction) one another. In additional embodiments, the steps 118 of the staircase structure 116 are arranged out of order, such that at least some steps 118 of the staircase structure 116 directly horizontally adjacent one another in the X-direction correspond to tiers 114 of stack structure 108 not directly vertically adjacent (e.g., in the Z-direction) one another.

At least some of the conductive contact structures 120 may contact (e.g., electrically contact, physically contact) at least some (e.g., each) of the steps 118 of the staircase structure 116 of the stack structure 108 to provide electrical access to the conductive structures 110 of the stack structure 108. At least some of the conductive contact structures 120 may be coupled to the conductive structures 110 of the tiers 114 of the stack structure 108 at the steps 118 of the staircase structure 116. As shown in FIG. 1A, at least some of the conductive contact structures 120 may physically contact and upwardly vertically extend (e.g., in the Z-direction) from the conductive structures 110 of the tiers 114 of the stack structure 108 at the steps 118 of the staircase structure 116. The staircase structure 116 of the stack structure 108 may include at least one conductive contact structure 120 physically contacting each step 118 thereof; or the staircase structure 116 of the stack structure 108 may be free of at least one conductive contact structure 120 physically contacting at least one step 118 thereof. In addition, as depicted in FIG. 1A, at one or more other of the conductive contact structures 120 may contact one or more of the additional conductive structures 111 within the source tier 109.

The conductive contact structures 120 may individually be formed of and include conductive material. By way of non-limiting example, the conductive contact structures 120 may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the conductive contact structures 120 are individually formed of and include W. Each of the conductive contact structures 120 may be substantially homogeneous, or one or more of the conductive contact structures 120 may individually be substantially heterogeneous. In some embodiments, each of the conductive contact structures 120 is formed to be substantially homogeneous. In additional embodiments, each of the conductive contact structures 120 is formed to be heterogeneous. Each conductive contact structure 120 may, for example, be formed of and include a stack of at least two different conductive materials.

Still referring to FIG. 1A, the cell pillar structures 122 may vertically extend through the tiers 114 of the stack structure 108, through the source tier 109, and to or into the isolation structure 107. The cell pillar structures 122 may each individually be formed of and include a stack of materials. By way of non-limiting example, each of the cell pillar structures 122 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second oxide dielectric material (e.g., $SiO_x$, such as $SiO_2$); a channel material, such as a semiconductive material (e.g., silicon, such as polycrystalline Si); and a dielectric fill material (e.g., a dielectric oxide, a dielectric nitride, air). The charge-blocking material may be formed on or over surfaces of the conductive structures 110 and the insulative structures 112 of the tiers 114 of stack structure 108 at least partially defining horizontal boundaries of the cell pillar structures 122; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material may be horizontally surrounded by the channel material.

With continued reference to FIG. 1A, intersections of the cell pillar structures 122 and the conductive structures 110 of the tiers 114 of the stack structure 108 may define vertically extending strings of memory cells 124 coupled in series with one another within the stack structure 108. In some embodiments, the memory cells 124 formed at the intersections of the conductive structures 110 and the cell pillar structures 122 within different tiers 114 of the stack structure 108 comprise so-called "MONOS" (metal-oxide-nitride-oxide-semiconductor) memory cells. In additional embodiments, the memory cells 124 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 124 comprise so-called "floating gate" memory cells including floating gates (e.g., metallic floating gates) as charge storage structures. The floating gates may horizontally intervene between central structures of the cell pillar structures 122 and the conductive structures 110 of the different tiers 114 of the stack structure 108.

As shown in FIG. 1A, the cell pillar structures 122 (and, hence, the vertically extending strings of the memory cells 124) may individually be coupled to at least one of the additional conductive structures 111 of source tier 109. In some embodiments, the cell pillar structures 122 directly physically contact some of the additional conductive structures 111 of the source tier 109 employed as lateral contact structures within the source tier 109, and the lateral contact structures are coupled (e.g., by way of one or more additional contact structures, such as one or more vertical contact structures) to one or more other of the additional conductive structures 111 of the source tier 109 employed as source structure(s) within the source tier 109.

Still referring to FIG. 1A, the deep contact structures 128 may vertically extend (e.g., in the Z-direction) through the stack structure 108 and the source tier 109 into the semiconductive base structure 102. The deep contact structures 128 may be configured and positioned to electrically connect one or more features (e.g., the conductive routing structures 134) of the conductive routing tier 130 vertically overlying the stack structure 108 with one or more additional features (e.g., structures, materials, device) to subsequently be formed vertically adjacent a modified vertical boundary of the semiconductive base structure 102, as described in further detail below. As shown in FIG. 1A, each of the deep contact structures 128 may include a first portion 128A vertically extending from the conductive routing tier 130, through the stack structure 108 and the source tier 109, and to the semiconductive base structure 102; and a second portion 128B vertically extending from an upper boundary of the semiconductive base structure 102 (and, hence, a lower boundary of the first portion 128A) and partially into the semiconductive base structure 102. The second portion 128B of each deep contact structure 128 may vertically terminate (e.g., vertically end) above lower vertical boundaries of the alignment mark structures 106 within the semiconductive base structure 102. In addition, the second portion 128B of each deep contact structure 128 may be positioned within horizontal boundaries (e.g., in the X-direction and the Y-direction) of an individual alignment mark structure 106 in the semiconductive base structure 102.

While in FIG. 1A the first portion 128A and the second portion 128B of each deep contact structure 128 are distinguished from one another by way of a dashed line, the first portion 128A and the second portion 128B of each deep contact structure 128 may be integral and continuous with one another. Put another way, each deep contact structure 128 may be a substantially monolithic structure including the first portion 128A and the second portion 128B. In additional embodiments, for one or more (e.g., each) of the deep contact structures 128, the first portion 128A thereof comprises a first conductive structure, and the second portion 128B thereof comprises a second conductive structure vertically neighboring (e.g., directly vertically under) and coupled to the first conductive structure. Put another way, at least one (e.g., each) of the deep contact structures 128 may individually comprise at least two discrete, vertically neighboring conductive structures in contact (e.g., electrical contact, physical contact) with one another.

The first portion 128A and the second portion 128B of each deep contact structure 128 may be formed substantially simultaneously with one another (e.g., through the same processing act), or the second portion 128B of each deep contact structure 128 may be formed prior to the formation of the first portion 128A of each deep contact structure 128. In some embodiments, the first portion 128A and the second portion 128B of each deep contact structure 128 are formed substantially simultaneously with one another. For example, following the formation of the stack structure 108 over the semiconductive base structure 102, blind vias (e.g., blind openings, blind apertures) may be formed to vertically extend through the stack structure 108 and partially into the semiconductive base structure 102 (e.g., partially into the alignment mark structures 106 in the semiconductive base structure 102). Thereafter, the blind vias may be filled with material to form the deep contact structures 128. In additional embodiments, the second portion 128B of each deep contact structure 128 is formed before the first portion 128A of each deep contact structure 128. For example, blind vias (e.g., blind through silicon vias (TSVs), blind through shallow trench isolation (STI) vias) may be formed in the semiconductive base structure 102 (e.g., within the alignment mark structures 106 thereof) and may be filled with material; and then, following the formation of the stack structure 108 over the semiconductive base structure 102, through vias (e.g., through array vias (TAVs)) may be formed to vertically extend through the stack structure 108 and to the filled blind vias and may be filled with additional material to form the deep contact structures 128. The filled through vias containing the first portions 128A of the deep contact structures 128 may be formed to be substantially horizontally aligned (e.g., in the X-direction and in the Y-direction) with the filled blind vias containing the second portions 128B of the deep contact structures 128.

The deep contact structures 128 may individually be formed of and include conductive material. In some embodiments, the deep contact structures 128 are formed of and include W. In additional embodiments, the deep contact structures 128 are formed of and include conductively doped polycrystalline silicon. Each of the deep contact structures 128 may be substantially homogeneous, or one or more of the conductive contact structures 120 may individually be substantially heterogeneous. In some embodiments, each of the deep contact structures 128 is formed to be substantially homogeneous. For each of the deep contact structures 128, a material composition and a material distribution of the first portion 128A thereof may be substantially the same as a material composition and a material distribution of the second portion 128B thereof. In additional embodiments, one or more (e.g., each) of the deep contact structures 128 is formed to be heterogeneous. One or more (e.g., each) of the deep contact structures 128 may, for example, be formed of and include a stack of at least two different conductive materials. By way of non-limiting example, for at least one (e.g., each) of the deep contact structures 128, the first portion 128A thereof may be formed to have a different material composition than the second portion 128B thereof.

Still referring to FIG. 1A, insulative liner structures may be formed to substantially continuously extend over and substantially cover side surfaces of one or more of the deep contact structures 128. The insulative liner structures may be horizontally interposed between the deep contact structures 128 and the conductive structures 110 (and the insulative structures 112) of the tiers 114 of the stack structure 108. The insulative liner structures may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative liner structures is formed of and includes at least one dielectric oxide material (e.g., $SiO_x$, such as $SiO_2$).

Within the at least one conductive muting tier 130 overlying the stack structure 108, the digit line structures 132 and conductive routing structures 134 may be formed to horizontally extend (e.g., in the X-direction, in the Y-direction) in desirable paths. While FIG. 1A depicts the microelectronic device structure 100 as being formed to include single (e.g., only) one conductive muting tier 130 formed over the stack structure 108, multiple (e.g., more than one) conductive routing tiers 130 may be formed over the stack structure 108. By way of non-limiting example, two or more (e.g., three or more) conductive muting tiers 130 may be formed over the stack structure 108. In such embodiments, the different conductive routing tiers 130 may have different configurations (e.g., different features, different feature configurations, different feature arrangements) than one another that together facilitate desirable conductive paths within the microelectronic device structure 100. At least some of the features (e.g., at least some conductive muting structures) of at least one of the different conductive routing tiers 130 may be electrically connected (e.g., by way of one or more vertically intervening conductive contact structures) to at least some of the features (e.g., at least some conductive routing structures) of at least one other of the different conductive routing tiers 130.

As shown in FIG. 1A, within an individual conductive muting tier 130 the digit line structures 132 and the conductive muting structures 134 may be located at substantially the same vertical position (e.g., elevation in the Z-direction) as one another within the microelectronic device structure 100. In addition, the digit line structures 132 and the conductive routing structures 134 may have substantially the same thickness (e.g., height in the Z-direction) as one another, or may have different thicknesses than one another. Moreover, the digit line structures 132 and the conductive routing structures 134 may have substantially the same material composition as one another, or may have different material compositions than one another. In some embodiments, the digit line structures 132 and the conductive muting structures 134 have substantially the same thickness as one another, and have substantially the same material composition as one another. The digit line structures 132 and the conductive routing structures 134 may, for example, be formed (e.g., simultaneously formed, sequentially formed) form patterning a common conductive material.

As shown in FIG. 1A, the digit line structures 132 may be formed vertically over and in electrical communication with the cell pillar structures 122 (and, hence, the vertically extending strings of memory cells 124). The digit line structures 132 may exhibit horizontally elongate shapes extending in parallel in a first horizontal direction (e.g., the Y-direction). As used herein, the term "parallel" means substantially parallel. The digit line structures 132 may each exhibit substantially the same dimensions (e.g., width in the X-direction, length in a Y-direction, height in the Z-direction), shape, and spacing (e.g., in the X-direction). In additional embodiments, one or more of the digit line structures 132 may exhibit one or more of at least one different dimension (e.g., a different length, a different width, a different height) and a different shape than one or more other of the digit line structures 132, and/or the spacing (e.g., in the X-direction) between at least two horizontally neighboring digit line structures 132 may be different than the spacing between at least two other horizontally neighboring digit line structures 132.

The conductive routing structures 134 may be formed vertically over and in electrical communication with additional features (e.g., structures, materials, devices) of the microelectronic device structure 100. For example, as shown in FIG. 1A, at least some of the conductive routing structures 134 may contact (e.g., electrically contact, physically contact) the conductive contact structures 120 and the deep contact structures 128 of the microelectronic device structure 100. Some of the conductive routing structures 134 may horizontally extend between and electrically connect at least some of the conductive contact structures 120 to some of the deep contact structures 128. The conductive routing structures 134 may facilitate electrical communication between further features (e.g., structures, materials, devices) to subsequently be coupled to the deep contact structures 128 following additional processing of the semiconductive base structure 102 and the conductive structures 110 of the stack structure 108 (and, hence, the vertically extending strings of memory cells 124) and the additional conductive structures 111 of the source tier 109, as described in further detail below.

The digit line structures 132 and the conductive muting structures 134 may individually be formed of and include conductive material. By way of non-limiting example, the digit line structures 132 and the conductive muting structures 134 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the digit line structures 132 and the conductive routing structures 134 are each individually formed of and include W. Each of the digit line structures 132 and each of the conductive routing structures 134 may individually be substantially homogeneous, or one or more of the digit line structures 132 and/or one or more of the conductive routing structures 134 may individually be substantially heterogeneous. If an individual digit line structure 132 or an individual conductive routing structure 134 is heterogeneous, amounts of one or more elements included in the digit line structure 132 or the conductive routing structure 134 may vary stepwise (e.g., change abruptly), or may vary continuously (e.g., change progressively, such as linearly, parabolically) throughout different portions of the digit line structure 132 or the conductive routing structure 134. In some embodiments, each of the digit line structures 132 is substantially homogeneous, and each of the conductive routing structure 134 is substantially homogeneous. In additional embodiments, one or more (e.g., each) of the digit line structures 132 is heterogeneous, and/or one or more (e.g., each) of the conductive routing structures 134 is heterogeneous. Each digit line structures 132 and each of the conductive routing structures 134 may, for example, individually be formed of and include a stack of at least two different conductive materials.

As shown in FIG. 1A, the digit line contact structures 126 may be formed to contact (e.g., electrically contact, physically contact) and vertically extend between the cell pillar structures 122 and the digit line structures 132. The digit line contact structures 126 may each individually be formed of and include conductive material. By way of non-limiting example, the digit line contact structures 126 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit line contact structures 126 are formed of and include W.

With continued reference to FIG. 1A, at least one isolation material 135 may be formed to cover and surround of portions of the semiconductive base structure 102, additional conductive structures 111 of the source tier 109, stack structure 108 (including conductive structures 110 and the insulative structures 112 thereof), the staircase structure(s) 116, the conductive contact structures 120, the cell pillar structures 122, the digit line contact structures 126, the deep contact structures 128, the digit line structures 132, and the conductive routing structures 134. The isolation material 135 may be formed of and include at least one insulative material. By way of non-limiting example, the isolation material 135 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 135 is formed of and includes $SiO_x$ (e.g., $SiO_2$). The isolation material 135 may be substantially homogeneous, or the isolation material 135 may be heterogeneous. In some embodiments, the isolation material 135 is substantially homogeneous. In additional embodiments, the isolation material 135 is heterogeneous. The isolation material 135 may, for example, be formed of and include a stack of at least two different dielectric materials.

Figure 1B:
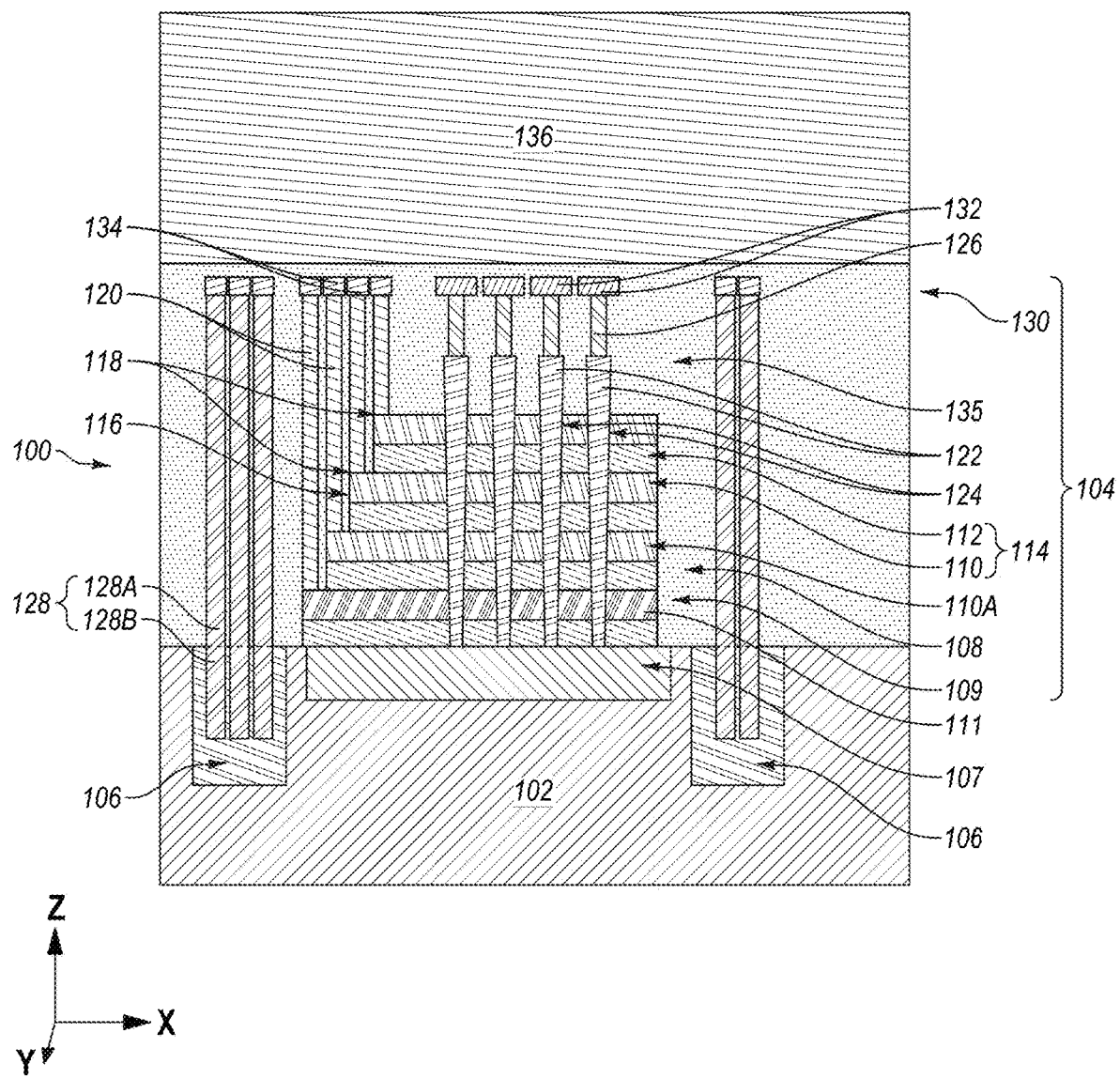

Referring to next to FIG. 1B, a support structure 136 may be provided over the conductive routing tier 130 of the microelectronic device structure 100. The support structure 136 may comprise a material or construction facilitating safe handling of the microelectronic device structure 100 for subsequent processing acts, as described in further detail below. The support structure 136 may be formed of and include one or more of semiconductive material (e.g., one or more of a silicon material, such monocrystalline silicon and/or polycrystalline silicon; silicon-germanium; germanium; gallium arsenide; a gallium nitride; gallium phosphide; indium phosphide; indium gallium nitride; and aluminum gallium nitride), a base semiconductive material on a supporting structure, an insulative material, a conductive material, a glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha$-$Al_2O_3$), and silicon carbide). The support structure 136 may include one or more layers, structures, and/or regions formed therein and/or thereon.

In some embodiments, the support structure 136 comprises a wafer (e.g., a semiconductive wafer, a glass wafer, a ceramic wafer) formed separate from and subsequently attached (e.g., bonded) to the microelectronic device structure 100. By way of non-limiting example, the support structure 136 may comprise a semiconductive wafer (e.g., a silicon wafer) including an insulative material (e.g., a dielectric oxide material, such as $SiO_x$) vertically neighboring a semiconductive material. The support structure 136 may be provided over the microelectronic device structure 100, and then insulative material thereof may be bonded (e.g., through oxide-oxide bonding) to portions of the isolation material 135 overlying and/or within the conductive routing tier 130 of the microelectronic device structure 100 to attach the support structure 136 to the microelectronic device structure 100.

In additional embodiments, the support structure 136 comprises at least one material (e.g., one or more of a semiconductive material, an insulative material, and a conductive material) formed (e.g., deposited, grown) on or over the conductive routing tier 130 of the conductive routing tier 130. By way of non-limiting example, the support structure 136 may comprise at least one insulative material formed on or over the conductive routing tier 130 of the microelectronic device structure 100, and, optionally, at least one additional material (e.g., at least one semiconductive material, at least one conductive material, at least one additional insulative material) formed on or over the insulative material. In such embodiments, the support structure 136 is formed, at least partially based on a material composition thereof and characteristics of the microelectronic device structure 100, to a thickness sufficient to facilitate safe handling (e.g., vertical inversion, transport) of the microelectronic device structure 100 during subsequent processing acts.

Figure 1C:
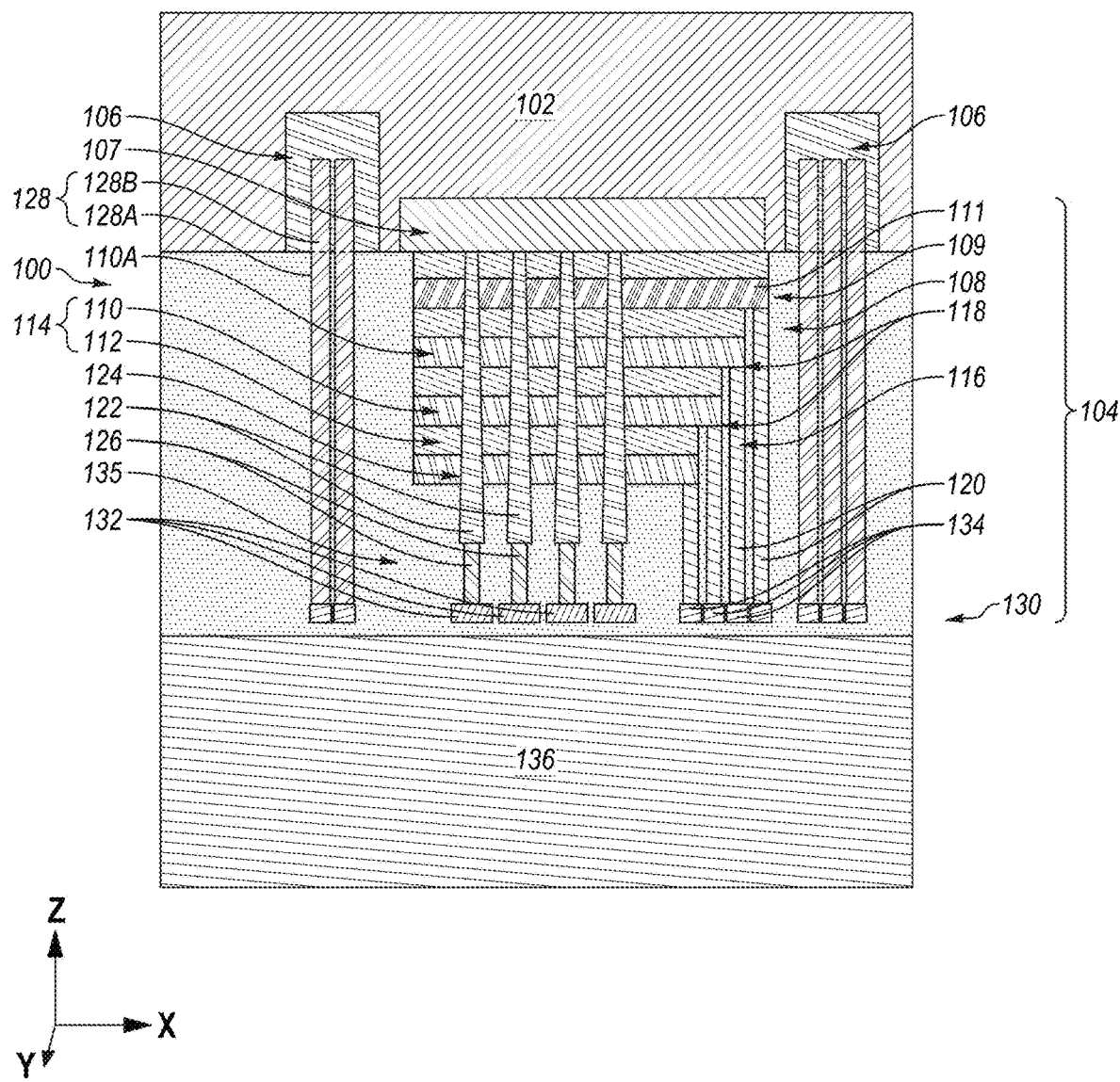

Referring next to FIG. 1C, after providing the support structure 136 over the microelectronic device structure 100, the combination of the microelectronic device structure 100 and the support structure 136 may be vertically inverted (e.g., flipped upside down in the Z-direction). As shown in FIG. 1C, after being vertically inverted, the memory array region 104 of the microelectronic device structure 100 may vertically underlie (in the Z-direction) the semiconductive base structure 102, and the support structure 136 may vertically underlie the memory array region 104. Within the memory array region 104, the additional conductive structures 111 may vertically overlie the stack structure 108 and the cell pillar structures 122, the stack structure 108 may vertically overlie the conductive routing tier 130 (including the digit line structures 132 and the conductive routing structures 134 thereof), and the conductive routing tier 130 may vertically overlie the support structure 136. After the stack structure 108 is vertically inverted, conductive structures 110 of the stack structure 108 having relatively greater widths in the X-direction may vertically overly other conductive structures 110 of the stack structure 108 having relatively smaller widths in the X-direction. For example, the first conductive structure 110A (e.g., employed as an SGS gate of the memory array region 104), which previously partially defined a vertically lowest step 118 of the staircase structure 116, may vertically overlie the other conductive structures 110 of the stack structure 108, and may partially define a vertically highest step 118 of the staircase structure 116.

Figure 1D:
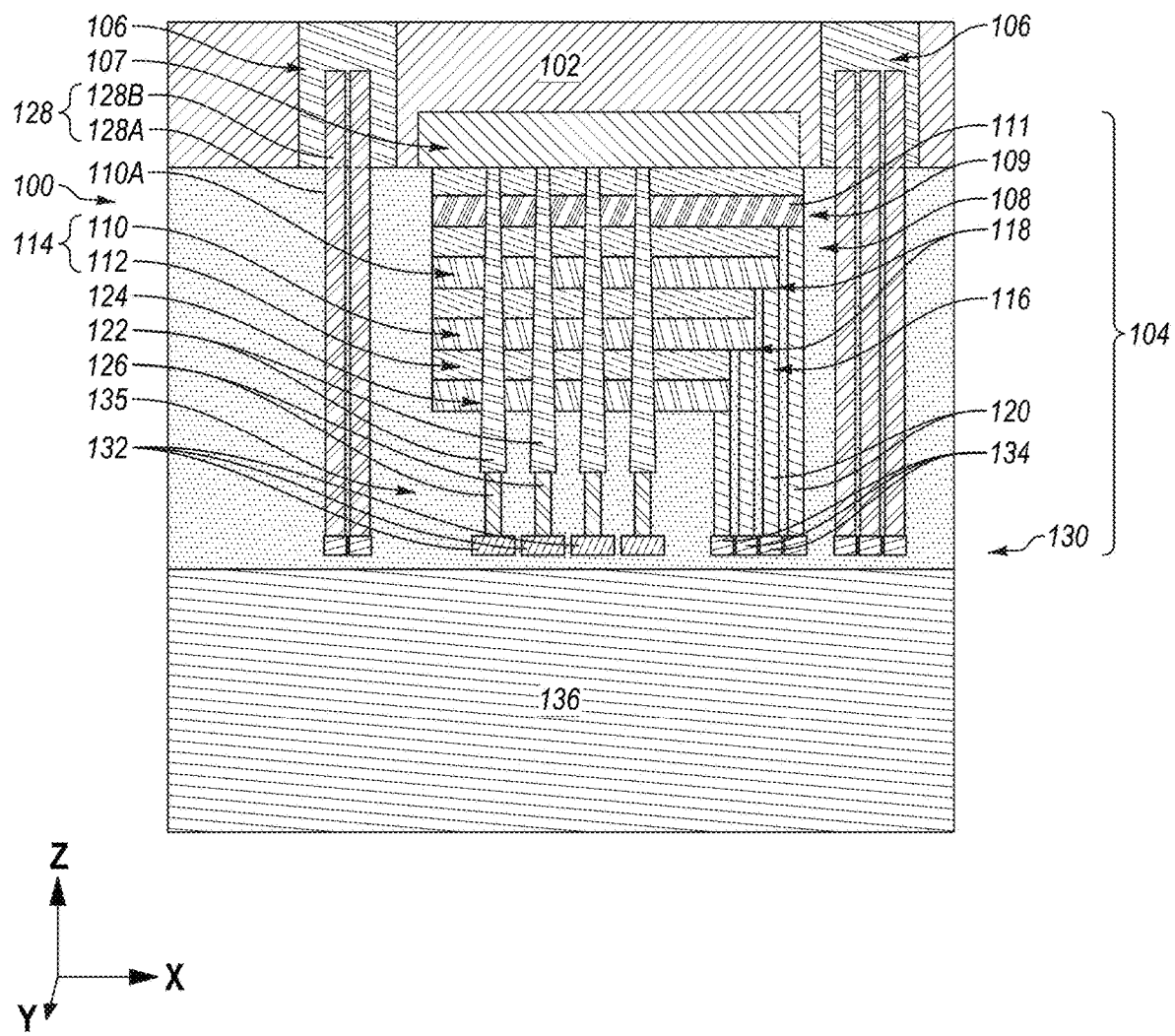

Referring next to FIG. 1D, a portion of the semiconductive base structure 102 may be removed to thin (e.g., reduce a vertical thickness in the Z-direction of) the semiconductive base structure 102 and expose (e.g., uncover) the alignment mark structures 106 therein. As shown in FIG. 1D, the material removal process may expose upper vertical boundaries (e.g., upper surfaces) of the alignment mark structures 106 which were previously lower vertical boundaries (e.g., lower surfaces) of the alignment mark structures 106 at the processing stage previously described with reference to FIG. 1A. An upper vertical boundary (e.g., an upper surface) of a remaining (unremoved) portion of the semiconductive material (e.g., silicon material, such as monocrystalline silicon) of the semiconductive base structure 102 may be substantially planar with upper vertical boundaries (e.g., upper surfaces) of the alignment mark structures 106.

In some embodiments, a portion of the semiconductive base structure 102 vertically overlying the alignment mark structures 106 is removed using one or more of at least one conventional grinding process (e.g., a conventional chemical-mechanical planarization (CMP) process) and at least one conventional etching process (e.g., at least one conventional dry etching process, at least one conventional wet etching process). In additional embodiments, a portion of the semiconductive base structure 102 vertically overlying the alignment mark structures 106 is removed using at least one so-called "smart cutting" process. By way one non-limiting example, prior to formation of the memory array region 104 over the semiconductive base structure 102, hydrogen ions may be implanted into semiconductive base structure 102 at a depth at or proximate vertical boundaries of the alignment mark structures 106 to be exposed at the processing stage being described with reference to FIG. 1D. Thereafter, at the processing stage being described with reference to FIG. 1D, the semiconductive base structure 102 may be heated to form voids (e.g., pockets, bubbles) at the vertical positions of the implanted hydrogen ions and effectively cut away the portion of the semiconductive base structure 102.

Optionally, following the removal of the portion of the semiconductive base structure 102, the microelectronic device structure 100 may be subjected to one or more processes to enhance desirable surface characteristics (e.g., surface smoothness) of the remaining (e.g., unremoved) portion of the semiconductive base structure 102. As a non-limiting example, additional semiconductive material may be epitaxially grown on an upper surface of the remaining portion of the semiconductive base structure 102. In some embodiments, following the removal of the portion of the semiconductive base structure 102, epitaxial silicon (e.g., monocrystalline silicon formed through epitaxial growth) is formed on the remaining portion of the semiconductive base structure 102. As another non-limiting example, the remaining portion of the semiconductive base structure 102 may be annealed (e.g., thermally annealed). In some embodiments, following the following the removal of the portion of the semiconductive base structure 102, the remaining portion of the semiconductive base structure 102 is thermally annealed.

Figure 1E:
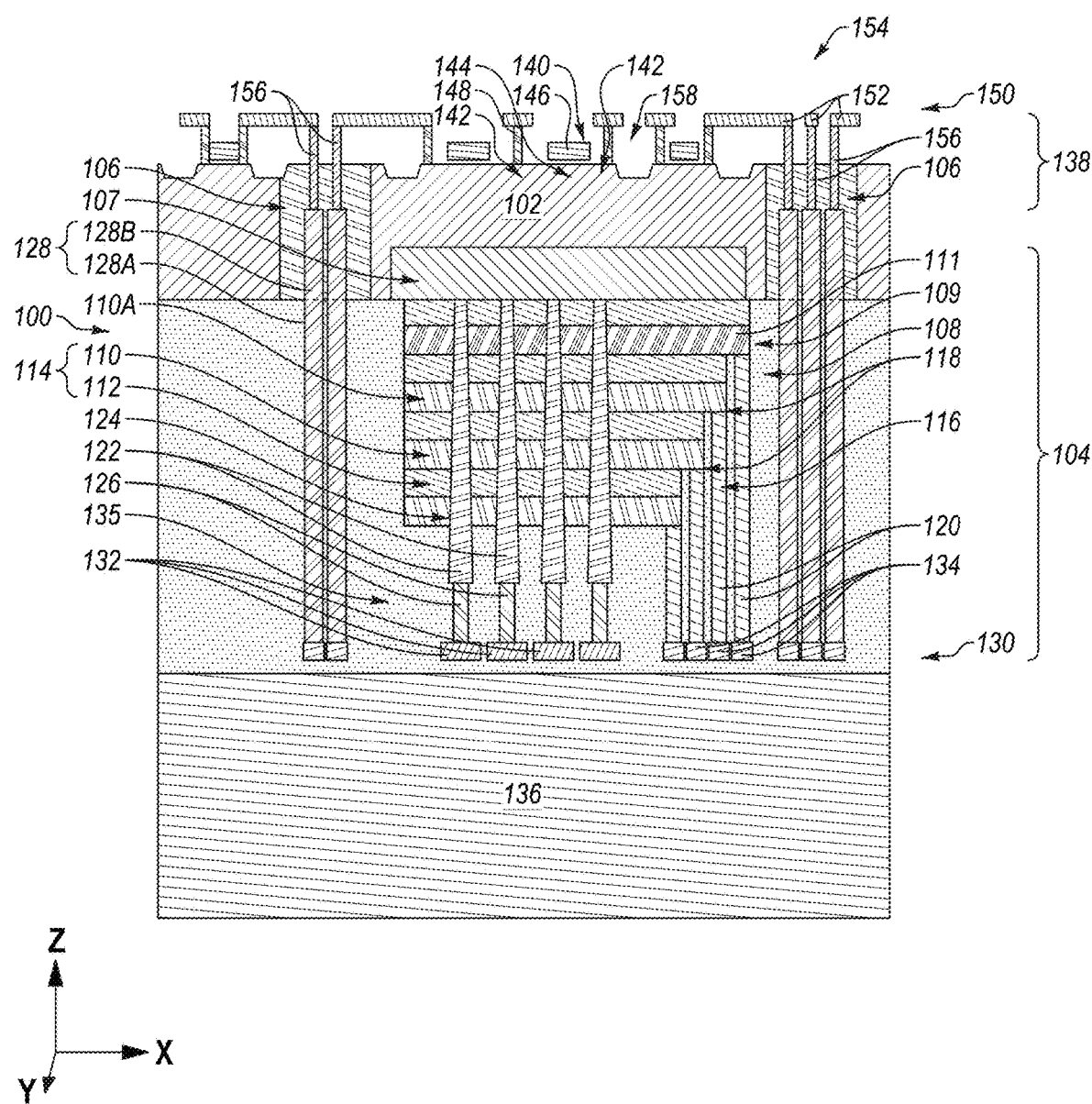

Referring next to FIG. 1E, a control logic region 138 may be formed over the memory array region 104 of the microelectronic device structure 100. As shown in FIG. 1E, the control logic region 138 may include part of a remaining (e.g., unremoved) portion of the semiconductive base structure 102 (including remaining portions of the alignment mark structures 106 formed therein), transistors 140, first contact structures 148, and an additional conductive routing tier 150 including additional conductive routing structures 152. The transistors 140, the first contact structures 148, and the additional conductive routing structures 152 may form control logic circuitry of various control logic devices 154 of the control logic region 138, as described in further detail below. The control logic region 138 may also include second contact structures 156 (e.g., conductively filled TSVs, conductively filled through STI vias) formed to couple one or more of the features (e.g., structures, materials, devices) of the control logic region 138 to more of more of the features of the memory array region 104 thereunder. The second contact structures 156 may, for example, be formed to couple one or more of the additional conductive routing structures 152 of the additional conductive routing tier 150 of the control logic region 138 to the deep contact structures 128 of the memory array region 104. The control logic region 138 further includes additional features (e.g., structures, materials, devices), as also described in further detail below.

As shown in FIG. 1E, the transistors 140 of the control logic region 138 may be formed to be vertically interposed between the isolation structure(s) 107 and the additional conductive routing structures 152 of additional conductive routing tier 150 of the control logic region 138. The transistors 140 may be formed to include conductively doped regions 142 (e.g., serving as source regions and drain regions of the transistors 140) within the semiconductive base structure 102, channel regions 144 within the semiconductive base structure 102 and individually horizontally interposed between the conductively doped regions 142, and gate structures 146 vertically overlying the channel regions 144. The transistors 140 may also include gate dielectric material (e.g., a dielectric oxide) formed to vertically intervene (e.g., in the Z-direction) between the gate structures 146 and the channel regions 144.

For the transistors 140 of the control logic region 138, the conductively doped regions 142 within the semiconductive base structure 102 may be doped with one or more desired dopants. In some embodiments, the conductively doped regions 142 are doped with at least one N-type dopant (e.g., one or more of phosphorus, arsenic, antimony, and bismuth). In some of such embodiments, the channel regions 144 within the semiconductive base structure 102 are doped with at least one P-type dopant (e.g., one or more of boron, aluminum, and gallium). In some other of such embodiments, the channel regions 144 within the semiconductive base structure 102 are substantially undoped. In additional embodiments, the conductively doped regions 142 are doped with at least one P-type dopant (e.g., one or more of boron, aluminum, and gallium). In some of such additional embodiments, the channel regions 144 within the semiconductive base structure 102 are doped with at least one N-type dopant (e.g., one or more of phosphorus, arsenic, antimony, and bismuth). In some other of such additional embodiments, the channel regions 144 within the semiconductive base structure 102 are substantially undoped.

The gate structures 146 may individually horizontally extend (e.g., in the Y-direction) between and be employed by multiple transistors 140 of the control logic region 138. The gate structures 146 may be formed of and include conductive material. The gate structures 146 may individually be substantially homogeneous, or the gate structures 146 may individually be heterogeneous. If an individual gate structure 146 is heterogeneous, amounts of one or more elements included in the gate structure 146 may vary stepwise (e.g., change abruptly), or may vary continuously (e.g., change progressively, such as linearly, parabolically) throughout different portions of the gate structure 146. In some embodiments, the gate structures 146 are each substantially homogeneous. In additional embodiments, the gate structures 146 are each heterogeneous. Individual gate structures 146 may, for example, be formed of and include a stack of at least two different dielectric materials.

Still referring to FIG. 1E, the first contact structures 148 may be formed to vertically extend between and couple the conductively doped regions 142 within the semiconductive base structure 102 (and, hence, the transistors 140) to one or more of the additional conductive muting structures 152 of the additional conductive routing tier 150. The first contact structures 148 may each individually be formed of and include conductive material. By way of non-limiting example, the first contact structures 148 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 148 are formed of and include W. In additional embodiments, the first contact structures 148 are formed of and include Cu.

The additional conductive routing structures 152 of the additional conductive routing tier 150 may vertically overlie (e.g., in the Z-direction) the first contact structures 148 and the transistors 140 of the control logic region 138. At least some of the additional conductive routing structures 152 may be employed as local muting structures of a microelectronic device (e.g., a memory device, such as a 3D NAND Flash memory device). The additional conductive muting structures 152 may each individually be formed of and include conductive material. By way of non-limiting example, the additional conductive muting structures 152 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the additional conductive routing structures 152 are formed of and include Cu. In additional embodiments, the additional conductive muting structures 152 are formed of and include W.

As previously mentioned, transistors 140, the first contact structures 148, and the additional conductive routing structures 152 form control logic circuitry of various control logic devices 154 of the control logic region 138. In some embodiments, the control logic devices 154 comprise complementary metal oxide semiconductor (CMOS) circuitry. The control logic devices 154 may be configured to control various operations of other components (e.g., memory cells) of a microelectronic device (e.g., a memory device) to subsequently be formed using microelectronic device structure 100. As a non-limiting example, the control logic devices 154 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry.

With continued reference to FIG. 1E, the second contact structures 156 may be formed vertically extend from some of the additional conductive routing structures 152, partially through the alignment mark structures 106 within the remaining portion of the semiconductive base structure 102, and to the second portions 128B of the deep contact structures 128. The second contact structures 156 may at least partially fill vias (e.g., TSVs) formed to vertically extend from some of the additional conductive routing structures 152, through portions of the alignment mark structures 106 vertically overlying the deep contact structures 128, and to the second portions 128B of the deep contact structures 128.

The second contact structures 156 may be formed of and include conductive material. The second contact structures 156 may facilitate electrical connections between the control logic devices 154 of the control logic region 138 and features (e.g., structures, materials, devices) of the memory array region 104. In some embodiments, the second contact structures 156 may each individually comprise metallic material, such as one or more of at least one metal, at least one alloy, and at least one conductive metal-containing material (e.g., a conductive metal nitride, a conductive metal silicide, a conductive metal carbide, a conductive metal oxide). In some embodiments, the second contact structures 156 are formed of and include W.

In some embodiments, at least one insulative liner material is formed to substantially continuously extend over and substantially cover side surfaces of one or more of the second contact structures 156. The insulative liner material may partially fill one or more vias (e.g., one or more TSVs) containing the one or more of the second contact structures 156. The insulative liner material may be horizontally interposed between the second contact structures 156 and the remaining portion of the semiconductive base structure 102. The insulative liner material may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative liner material is formed of and includes at least one dielectric oxide material (e.g., $SiO_x$, such as $SiO_2$). In additional embodiments, the insulative liner material is omitted.

Still referring to FIG. 1C, at least one additional isolation material 158 may be formed to cover and surround of the remaining portion of the semiconductive base structure 102, as well as portions of the transistors 140, the additional conductive routing structures 152, the first contact structures 148, and the second contact structures 156. The additional isolation material 158 may be formed of and include at least one insulative material. By way of non-limiting example, the additional isolation material 158 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the additional isolation material 158 is formed of and includes $SiO_x$ (e.g., $SiO_2$). The additional isolation material 158 may be substantially homogeneous, or the isolation material 135 may be heterogeneous. If the additional isolation material 158 is heterogeneous, amounts of one or more elements included in the additional isolation material 158 may vary stepwise (e.g., change abruptly), or may vary continuously (e.g., change progressively, such as linearly, parabolically) throughout different portions of the additional isolation material 158. In some embodiments, the additional isolation material 158 is substantially homogeneous. In additional embodiments, the additional isolation material 158 is heterogeneous. The additional isolation material 158 may, for example, be formed of and include a stack of at least two different dielectric materials.

The processing stages described above with reference to FIGS. 1A through 1E resolve limitations on conventional control logic device configurations and associated conventional microelectronic device performance (e.g., speed, data transfer rates, power consumption) that may otherwise result from thermal budget constraints imposed by conventional formation and/or conventional processing of arrays (e.g., memory cell arrays, memory element arrays, access device arrays) for a conventional microelectronic device. For example, by forming the control logic region 138 (FIG. 1E) after the formation of the memory array region 104, configurations of the control logic devices 154 within the control logic region 138 are not limited by the processing conditions (e.g., temperatures, pressures, materials) required to form components (e.g., memory cells, memory elements, access devices) of the memory array region 104.

Figure 2A:
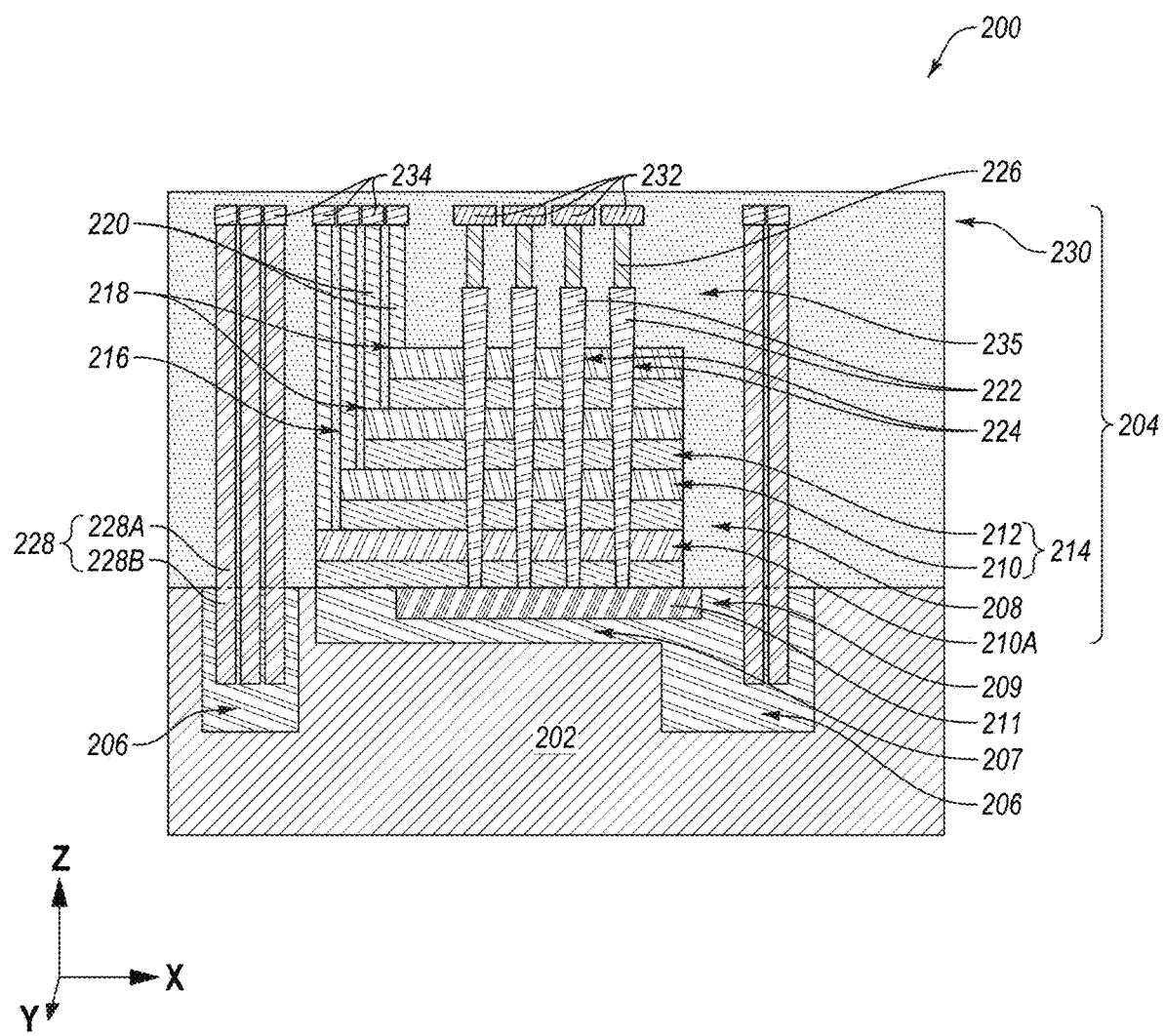
FIGS. 2A and 2B are simplified, partial cross-sectional views illustrating a method of forming a microelectronic device, in accordance with additional embodiments of the disclosure.
Figure 2B:
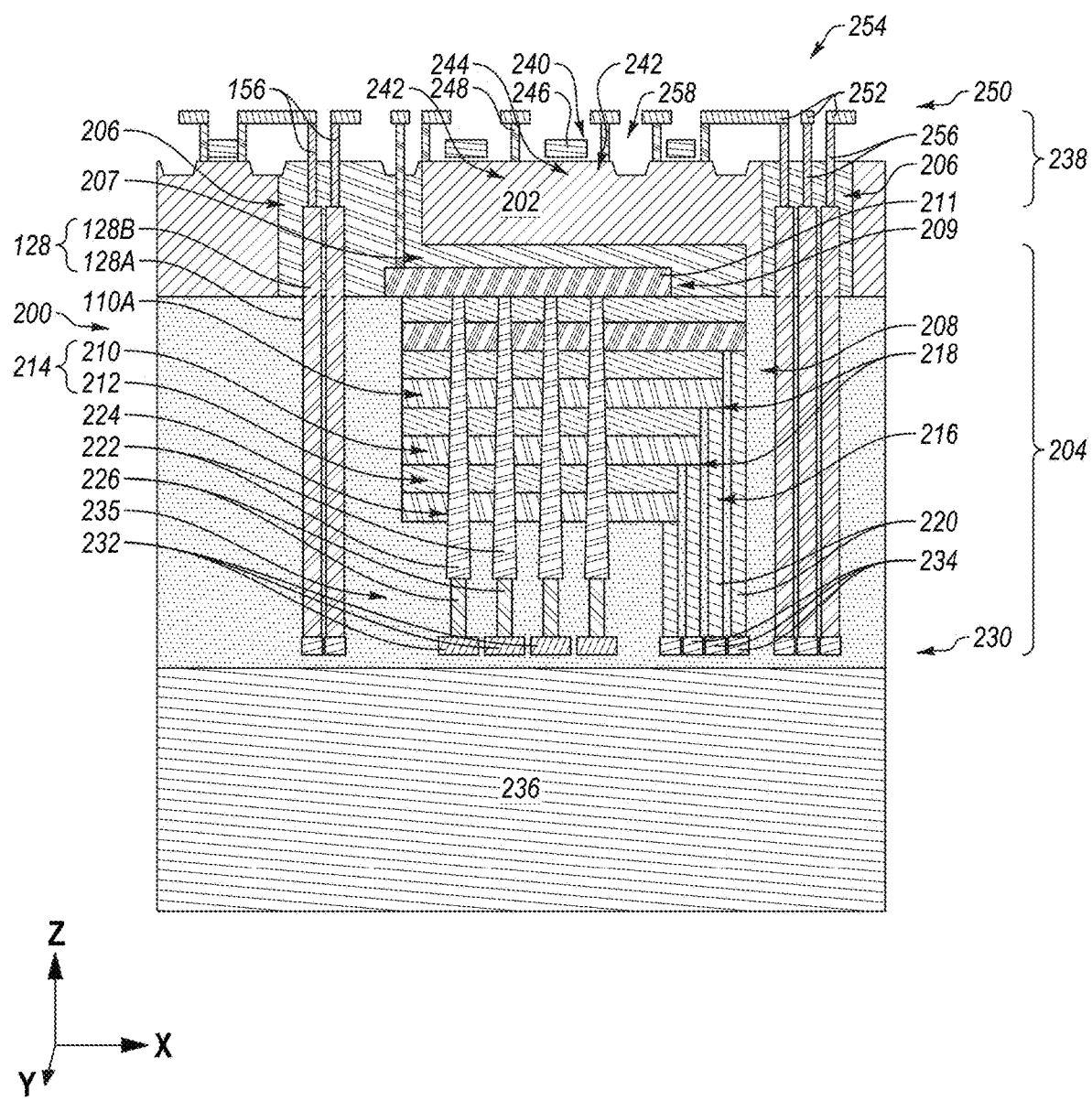

In additional embodiments, the microelectronic device structure 100 is formed to have a different configuration (e.g., different features, different feature configurations, different feature arrangements) than that previously described with reference to FIG. 1E. One or more processing acts at one or more of the processing stages previously described with reference to FIGS. 1A through 1E may be modified to facilitate the different configuration of the microelectronic device structure 100. By way of non-limiting example, FIGS. 2A and 2B are simplified partial cross-sectional views illustrating embodiments of an additional method of forming a microelectronic device (e.g., a memory device, such as a 3D NAND Flash memory device). To avoid repetition, not all features (e.g., structures, materials, regions, devices) shown in FIGS. 2A and 2B are described in detail herein. Rather, unless described otherwise below, in FIGS. 2A and 2B, a feature designated by a reference numeral that is a 100 increment of the reference numeral of a feature previously described with reference to one or more of FIGS. 1A through 1E will be understood to be substantially similar to the previously described feature. With the description provided below, it will be readily apparent to one of ordinary skill in the art that the methods and structures described herein may be used to form various devices and electronic systems.

Referring to FIG. 2A, a microelectronic device structure 200 may be formed to include a semiconductive base structure 202, and a memory array region 204 over the semiconductive base structure 202. The microelectronic device structure 200 may be formed to be similar to the microelectronic device structure 100 at the processing stage previously described with reference to FIG. 1A, except that configurations of the source tier 209 (including configurations of the additional conductive structures 211 thereof), one or more of the alignment mark structures 206, and the isolation structure(s) 207 may be formed to be different than the configurations of the source tier 109 (FIG. 1A, including the configurations of the additional conductive structures 111 thereof), one or more of the alignment mark structures 106 (FIG. 1A), and the isolation structure(s) 107 (FIG. 1A), respectively. Consequently, interactions of some features (e.g., the additional conductive structures 211) of the microelectronic device structure 200 with other features (e.g., the isolation structure(s) 207, the cell pillar structures 222) of the microelectronic device structure 200 may also be different than the interactions of similar features (e.g., the additional conductive structures 111) of the microelectronic device structure 100 with other features (e.g., the isolation structure(s) 107, the cell pillar structures 122) of the microelectronic device structure 100, as described in further detail below.

The source tier 209 may be positioned at and/or within vertical boundaries (e.g., in the Z-direction) of the isolation structure(s) 207 within the semiconductive base structure 202. In some embodiments, the source tier 209 at least partially (e.g., substantially) underlies an upper vertical boundary of the isolation structure(s) 207. For example, as shown in FIG. 2A, the additional conductive structures 211 (e.g., source structure(s), contact structures) of the source tier 209 may be formed within the isolation structure(s) 207. In some of such embodiments, upper vertical boundaries (e.g., upper surfaces) of at least some of the additional conductive structures 211 of the source tier 209 are formed to be substantially coplanar with the upper vertical boundary of the isolation structure(s) 207. In other of such embodiments, upper vertical boundaries of at least some of the additional conductive structures 211 of the source tier 209 are formed to be vertically offset (e.g., vertically overlie, vertically underlie) from the upper vertical boundary of the isolation structure(s) 207. In additional embodiments, the source tier 209 is formed over and directly vertically adjacent the upper vertical boundary of the isolation structure(s) 207. For example, each of the additional conductive structures 211 of the source tier 209 may be formed on or over the isolation structure(s) 207. In some of such embodiments, lower vertical boundaries (e.g., lower surfaces) of at least some (e.g., each) of the additional conductive structures 211 of the source tier 209 are formed to be directly vertically adjacent (e.g., on) the upper vertical boundary (e.g., upper surface) of the isolation structure(s) 207.

Still referring to FIG. 2A, the horizontal area of one or more of the alignment mark structures 206 may be formed to horizontally overlap the horizontal area of at least some of the additional conductive structures 211 of the source tier 209. For example, a portion of at least one of the alignment mark structures 206 may be located within horizontal boundaries (e.g., in the X-direction) of at least one of the additional conductive structures 211 (e.g., source structure(s)) of the source tier 209. The horizontal overlap of the alignment mark structure(s) 206 with the additional conductive structure(s) 211 may facilitate the subsequent formation of one or more contact structures vertically extending through the alignment mark structure(s) 206 and to the additional conductive structure(s) 211, as described in further detail below. In some embodiments, at least one of the alignment mark structures 206 is formed to horizontally overlap the isolation structure(s) 207. In some of such embodiments, the alignment mark structure 206 is formed to be substantially continuous with the isolation structure(s) 207, such that the alignment mark structure 206 and the isolation structure(s) 207 together form a single (e.g., only one) monolithic structure. In other of such embodiments, one or more portions of an individual isolation structure 207 is/are formed within one or more of the alignment mark structures 206, but the isolation structure 207 and the alignment mark structure(s) 206 remain discrete (e.g., separated by an interface) from one another.

As shown in FIG. 2A, the cell pillar structures 222 may individually be formed to vertically terminate (e.g., vertically end) within the source tier 209. Lower vertical ends of the cell pillar structures 222 may physically contact upper surfaces of some of the additional conductive structures 211 of the source tier 209. In some embodiments, the lower vertical ends of the cell pillar structures 222 directly physically contact one or more of the additional conductive structures 211 employed as source structure(s) within the source tier 209. In some such embodiments, none of additional conductive structures 211 within the source tier 209 are employed as lateral contact structures horizontally extending between and electrically connecting the cell pillar structures 222 and the additional conductive structures 211 serving as source structure(s) within the source tier 209. In additional embodiments, the lower vertical ends of the cell pillar structures 222 directly physically contact one or more of the additional conductive structures 211 employed as lateral contact structures within the source tier 209, and the lateral contact structures are coupled (e.g., by way of one or more additional contact structures, such as one or more vertical contact structures) to one or more other of the additional conductive structures 211 of the source tier 209 employed as source structure(s) within the source tier 209.

Referring next to FIG. 2B, the microelectronic device structure 200 may be subjected to processing stages and processing acts substantially similar to those previously described with reference to FIGS. 1B through 1D, and then a control logic region 238 may be formed over the memory array region 204 of the microelectronic device structure 200 through a process similar to that previously described with reference to FIG. 1E. The control logic region 238 (including transistors 240, first contact structures 248, additional conductive routing structures 252, control logic devices 254, and second contact structures 256 thereof) may be substantially similar to the control logic region 138 (including the transistors 140, the first contact structures 148, the additional conductive muting structures 252, the control logic devices 254, and the second contact structures 256 thereof) previously described with reference to FIG. 1E, except that one or more (but not all) of the second contact structures 256 thereof may be formed to vertically extend through at least one of the alignment mark structures 206 and contact (e.g., physically contact, electrically contact) one or more of the additional conductive structures 211 (e.g., source structure(s)) within the source tier 209. The one or more of the second contact structures 256 may, for example, be employed to couple control logic circuitry of the control logic region 238 to the one or more additional conductive structures 211 within the source tier 209.

Thus, in accordance with embodiments of the disclosure, a method of forming a microelectronic device comprises forming a memory array region comprising memory cells vertically over a base structure comprising a semiconductive material and alignment mark structures vertically extending into the semiconductive material. First contact structures are formed to vertically extend through the memory array region and into the alignment mark structures of the base structure. A support structure is formed over the memory array region. A portion of the base structure is removed to expose the alignment mark structures after forming the support structure over the memory array region. A control logic region is formed vertically adjacent a remaining portion of the base structure. The control logic region comprises control logic devices in electrical communication with the first contact structures by way of second contact structures vertically extending partially through the alignment mark structures and contacting the first contact structures.

Furthermore, a microelectronic device according to embodiments of the disclosure comprises a memory array region, a semiconductive structure, conductive contact structures, a control logic region, and additional conductive contact structures. The memory array region comprises memory cells. The semiconductive structure overlies the memory array region and comprises alignment mark structures vertically extending through semiconductive material. The conductive contact structures vertically extend through the memory array region and partially into the alignment mark structures. The control logic region partially overlies the semiconductive structure and comprises transistors and routing structures overlying and in electrical communication with the transistors. The additional conductive contact structures vertically extend from some of the routing structures, partially through the alignment mark structures, and to the conductive contact structures.

In addition, in accordance with embodiments of the disclosure, a method of forming a memory device comprises forming a memory device structure. The memory device structure comprises a semiconductive base structure comprising alignment mark structures partially vertically extending through a semiconductive material; a stack structure over the source structure, the stack structure comprising tiers each comprising a conductive structure and an insulative structure vertically neighboring the conductive structure; a source structure between the stack structure and the semiconductive base structure; a muting tier comprising digit line structures and conductive routing structures over the stack structure; strings of memory cells vertically extending through stack structure and in electrical communication with the source structure and the digit line structures; and deep contact structures vertically extending from some of the conductive muting structures, through the stack structure, and partially into the alignment mark structures. A support structure is formed over the muting tier of the memory device structure. The memory device structure and the support structure are vertically inverted. A thickness of the semiconductive base structure is reduced to expose the alignment mark structures after vertically inverting the memory device structure and the support structure. Control logic devices are formed in electrical communication with the deep contact structures by way of additional contact structures vertically extending through the alignment mark structures and to the deep contact structures.

Moreover, a memory device according to embodiments of the disclosure comprises muting tier, a stack structure, a source structure, strings of memory cells, a semiconductive structure, first conductive contact structures, control logic circuitry, and second conductive contact structures. The muting tier comprises digit line structures and conductive routing structures overlying a base structure. The stack structure overlies the muting tier and comprises vertically neighboring tiers. Each of the vertically neighboring tiers individually comprises a conductive structure and an insulative structure vertically neighboring the conductive structure. The source structure overlies the stack structure. The strings of memory cells vertically extend through the stack structure and are coupled to the digit line structures and the source structure. The semiconductive structure at least partially overlies the source structure and comprises alignment mark structures vertically extending completely therethrough. The first conductive contact structures vertically extend from some of the conductive muting structures, through the stack structure, and into the alignment mark structures. The control logic circuitry overlies the semiconductive structure. The second conductive contact structures extend from the control logic circuitry, through the semiconductive structure, and into the alignment mark structures. The second conductive contact structures are in electrical communication with the first conductive contact structures.

Figure 3:
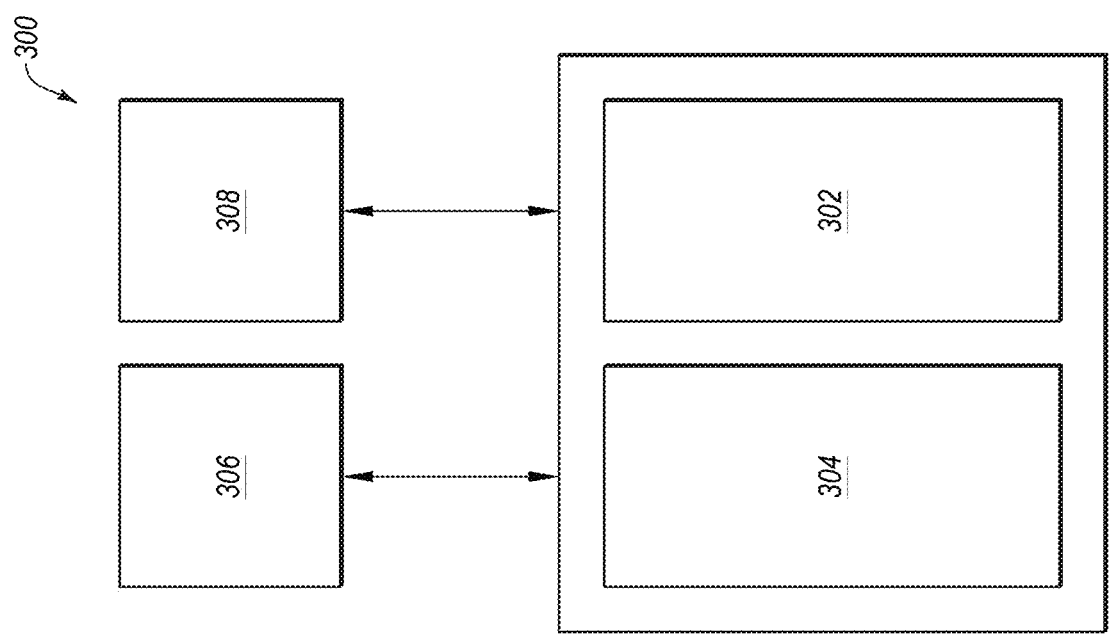
FIG. 3 is a schematic block diagram of an electronic system, in accordance with an embodiment of the disclosure.

Microelectronic devices structures (e.g., the microelectronic device structure 100 following the processing stage previously described with reference to FIG. 1E; the microelectronic device structure 200 following the processing stage previously described with reference to FIG. 2B) and microelectronic devices in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, a microelectronic device structure (e.g., the microelectronic device structure 100 following the processing stage previously described with reference to FIG. 1E; the microelectronic device structure 200 following the processing stage previously described with reference to FIG. 2B) previously described herein. The electronic system 300 may further include at least one electronic signal processor device 304 (often referred to as a "microprocessor"). The electronic signal processor device 304 may, optionally, include a microelectronic device structure (e.g., the microelectronic device structure 100 following the processing stage previously described with reference to FIG. 1E; the microelectronic device structure 200 following the processing stage previously described with reference to FIG. 2B) previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include a microelectronic device structure (e.g., the microelectronic device structure 100 following the processing stage previously described with reference to FIG. 1E; the microelectronic device structure 200 following the processing stage previously described with reference to FIG. 2B) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device and comprising. The memory device comprises a memory array region, a semiconductive structure, a control logic region, deep contact structures, and additional contact structures. The memory array region comprises an array of memory cells and conductive routing structures underlying and in electrical communication with the array of memory cells. The semiconductive structure overlies the memory array region. The control logic region overlies the semiconductive structure and comprises CMOS circuitry. The deep contact structures vertically extend from some of the conductive routing structures and into the semiconductive structure. The additional contract structures are in electrical communication with the CMOS circuitry and the deep contact structures. The additional contact structures extend from the CMOS circuitry to ends of the deep contact structures within vertical boundaries of the semiconductive structure.

Thus, in accordance with embodiments of the disclosure, an electronic system comprises an input device, an output device, a processor device operably connected to the input device and the output device, and a memory device operably connected to the processor device and comprising. The memory device comprises a memory array region, a semiconductive structure, a control logic region, deep contact structures, and additional contract structures. The memory array region comprises an array of memory cells and conductive routing structures underlying and in electrical communication with the array of memory cells. The semiconductive structure overlies the memory array region. The control logic region overlies the semiconductive structure and comprises CMOS circuitry. The deep contact structures vertically extend from some of the conductive routing structures and into the semiconductive structure. The additional contract contact structures are in electrical communication with the CMOS circuitry and the deep contact structures. The additional contact structures extend from the CMOS circuitry to ends of the deep contact structures within vertical boundaries of the semiconductive structure.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A memory device, comprising:
a stack structure comprising tiers respectively including conductive material and insulative material vertically adjacent the conductive material;
an array of cell pillar structures vertically extending through the stack structure;
an inverted staircase structure comprising horizontal ends of at least some of the tiers of the stack structure, relatively vertically higher steps of the inverted staircase structure horizontally positioned farther away from the array of cell pillar structures than relatively vertically lower steps of the inverted staircase structure;
a conductive routing tier vertically underlying the stack structure and comprising conductive line structures coupled to the array of cell pillar structures;
lateral contact structures vertically overlying the stack structure and coupled to the array of cell pillar structures;
an insulative structure vertically overlying and horizontally overlapping the lateral contact structures, the array of cell pillar structures vertically extending through the lateral contact structures to the insulative structure;
additional insulative structures horizontally neighboring the insulative structure, at least some of the contact structures horizontally overlapping the additional insulative structures;
control logic circuitry vertically overlying the lateral contact structures; and
contact structures coupled to the control logic circuitry and vertically extending from the control logic circuitry to the conductive routing tier.

2. The memory device of claim 1, wherein the insulative structure has a smaller vertical dimension than each of the additional insulative structures.

3. The memory device of claim 1, wherein the at least some of the contact structures comprise:
first contact structures vertically extending from the conductive routing tier and partially through the additional insulative structures; and
second contact structures vertically extending from the first contact structures to conductive routing structures of the control logic circuitry.

4. The memory device of claim 3, wherein each of the additional insulative structures has multiple of the first contact structures and multiple of the second contact structures within a horizontal area thereof.

5. The memory device of claim 1, further comprising semiconductor material substantially covering sidewalls of the additional insulative structures and substantially covering sidewalls and an upper surface of the insulative structure.

6. The memory device of claim 5, wherein portions of the semiconductor material are horizontally interposed between the sidewalls of the insulative structure and the sidewalls of the additional insulative structures.

7. The memory device of claim 5, wherein portions of the semiconductor material define source regions, drain regions, and channel regions of transistors of the control logic circuitry.

8. The memory device of claim 1, further comprising additional contact structures individually vertically extending from a respective step of the inverted staircase structure to the conductive routing tier.

9. A memory device, comprising:
control logic circuitry comprising transistors respectively including a source region, a drain region, and a channel region within a semiconductor structure;
an insulative structure within the semiconductor structure and comprising:
a first portion extending completely through the semiconductor structure; and
a second portion integral with a lower section of the first portion and extending only partially through the semiconductor structure;
a conductive source structure within a horizontal area of the second portion of the insulative structure and coupled to the control logic circuitry;
conductive contact structures within a horizontal area of the first portion of the insulative structure and coupled to the control logic circuitry;
a stack structure underlying the insulative structure and comprising tiers respectively including conductive material and insulative material vertically adjacent the conductive material;
an array of cell pillar structures coupled to the conductive source structure and vertically extending through the stack structure;
an inverted staircase structure comprising horizontal ends of at least some of the tiers of the stack structure, relatively vertically higher steps of the inverted staircase structure horizontally positioned farther away from the array of cell pillar structures than relatively vertically lower steps of the inverted staircase structure; and
a conductive routing tier underlying the stack structure and comprising:
conductive digit line structures coupled to the array of cell pillar structures; and
conductive routing structures coupled to the conductive contact structures.

10. The memory device, of claim 9, wherein:
a first portion of the conductive source structure is within a horizontal area of the first portion of the insulative structure; and
a second portion of the conductive source structure is within the horizontal area of the second portion of the insulative structure.

11. The memory device, of claim 10, further comprising an additional conductive contact structure within the horizontal area of the second portion of the insulative structure and vertically extending from the conductive source structure to additional conductive routing structures of the control logic circuitry.

12. The memory device, of claim 9, further comprising:
an additional insulative structure within the semiconductor structure and horizontally offset from the insulative structure; and
additional conductive contact structures within a horizontal area of the additional insulative structure and coupled to the conductive routing structures of the conductive routing tier and additional conductive routing structures of the control logic circuitry.

13. The memory device, of claim 12, wherein the additional insulative structure has substantially planar sidewalls extending from a lowermost boundary of the semiconductor structure to an uppermost boundary of the semiconductor structure.

14. The memory device, of claim 9, further comprising further contact structures individually vertically extending from a respective step of the inverted staircase structure to the conductive routing structures of the conductive routing tier.

15. A 3D NAND Flash memory device, comprising:
strings of memory cells vertically extending through a stack structure having tiers each including conductive material and insulative material vertically adjacent the conductive material;
an inverted staircase structure comprising horizontal ends of at least some of the tiers of the stack structure, relatively vertically lower steps of the inverted staircase structure horizontally positioned closer to one of the strings of memory cells than relatively vertically higher steps of the inverted staircase structure;
a semiconductor structure vertically overlying the strings of memory cells;
insulative structures vertically extending completely through the semiconductor structure and horizontally offset from the stack structure;
control logic devices at an upper end of the semiconductor structure; and
conductive contacts within horizontal areas of the insulative structures and coupled to the control logic devices and the strings of memory cells.

16. The 3D NAND Flash memory device of claim 15, further comprising:
a conductive lateral contact vertically underlying the semiconductor structure and coupled to the strings of memory cells; and
conductive digit lines vertically underlying the stack structure and coupled to the strings of memory cells.

17. The 3D NAND Flash memory device of claim 15, further comprising:
a conductive source structure coupled to the strings of memory cells and vertically positioned between a lowermost boundary and an uppermost boundary of the semiconductor structure; and
conductive digit lines coupled to the strings of memory cells and vertically underlying the stack structure.

18. The 3D NAND Flash memory device of claim 15, wherein the conductive contacts comprise:
first conductive contacts individually vertically extending from conductive routing of the control logic devices and partially through a respective one of the insulative structures; and
second conductive contacts horizontally overlapping the first conductive contacts and individually vertically extending from a respective one of the first conductive contacts to additional conductive routing vertically underlying the stack structure.

* * * * *

UNITED STATES PATENT AND TRADEMARK OFFICE
CERTIFICATE OF CORRECTION

PATENT NO. : 12,207,473 B2
APPLICATION NO. : 18/499703
DATED : January 21, 2025
INVENTOR(S) : Umberto Maria Meotto et al.

Page 1 of 2

It is certified that error appears in the above-identified patent and that said Letters Patent is hereby corrected as shown below:

In the Specification

| | | |
|---|---|---|
| Column 4, | Line 43, | change "hafnium (H), tantalum (Ta)," to --hafnium (Hf), tantalum (Ta),-- |
| Column 6, | Line 4, | change "conductive muting tier" to --conductive routing tier-- |
| Column 9, | Line 43, | change "such as $SiO_x$, (e.g.," to --such as $SiO_x$ (e.g.,-- |
| Column 13, | Line 34, | change "conductive muting tier" to --conductive routing tier-- |
| Column 13, | Line 40, | change "conductive muting tier" to --conductive routing tier-- |
| Column 13, | Line 44, | change "conductive muting tiers" to --conductive routing tiers-- |
| Column 13, | Line 51, | change "conductive muting structures)" to --conductive routing structures)-- |
| Column 13, | Lines 58-59, | change "conductive muting tier" to --conductive routing tier-- |
| Column 13, | Lines 59-60, | change "conductive muting structures" to --conductive routing structures-- |
| Column 14, | Lines 4-5, | change "conductive muting structures" to --conductive routing structures-- |
| Column 14, | Lines 53-54, | change "conductive muting structures" to --conductive routing structures-- |
| Column 14, | Lines 56-57, | change "conductive muting structures" to --conductive routing structures-- |
| Column 19, | Line 26, | change "conductive muting structures" to --conductive routing structures-- |
| Column 19, | Line 43, | change "local muting structures" to --local routing structures-- |

Signed and Sealed this
Twenty-fifth Day of March, 2025

Coke Morgan Stewart
*Acting Director of the United States Patent and Trademark Office*

| | | |
|---|---|---|
| Column 19, | Lines 45-46, | change "conductive muting structures" to --conductive routing structures-- |
| Column 19, | Line 48, | change "conductive muting structures" to --conductive routing structures-- |
| Column 19, | Lines 55-56, | change "conductive muting structures" to --conductive routing structures-- |
| Column 23, | Line 40, | change "FIGS. 1B through ID, and then" to --FIGS. 1B through 1D, and then-- |
| Column 23, | Line 50, | change "conductive muting structures" to --conductive routing structures-- |
| Column 24, | Line 41, | change "a muting tier" to --a routing tier-- |
| Column 24, | Line 47, | change "conductive muting structures," to --conductive routing structures,-- |
| Column 24, | Line 49, | change "the muting tier" to --the routing tier-- |
| Column 24, | Line 60, | change "comprises muting tier," to --comprises routing tier,-- |
| Column 24, | Lines 63-64, | change "The muting tier" to --The routing tier-- |
| Column 24, | Line 66, | change "the muting tier" to --the routing tier-- |
| Column 25, | Line 10, | change "conductive muting structures," to --conductive routing structures.-- |
| Column 26, | Lines 10-31, | DELETE PARAGRAPH BEGINNING "Thus, in accordance with embodiments of the disclosure," THROUGH END "vertical boundaries of the semiconductive structure." |
| Column 26, | Lines 47-48, | change "The additional contract contact structures" to --The additional contact structures-- |